United States Patent
Bates et al.

(10) Patent No.: US 7,898,924 B2
(45) Date of Patent: Mar. 1, 2011

(54) APPARATUS, SYSTEM, AND METHOD FOR CALIBRATING A HOLOGRAPHIC STORAGE DEVICE

(75) Inventors: Allen Keith Bates, Tucson, AZ (US); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 1208 days.

(21) Appl. No.: 11/470,960

(22) Filed: Sep. 7, 2006

(65) Prior Publication Data
US 2008/0062796 A1    Mar. 13, 2008

(51) Int. Cl.
*G11B 7/00* (2006.01)
*G03H 1/22* (2006.01)

(52) U.S. Cl. .......... 369/103; 359/32

(58) Field of Classification Search .......... 359/1–35; 365/216; 369/44.25, 44.35–44.36, 44.39, 369/47.17, 47.39, 47.5–47.53, 53.15–53.17, 369/53.22, 53.25–53.27, 53.33, 53.35–53.36, 369/103
See application file for complete search history.

(56) References Cited

U.S. PATENT DOCUMENTS

| | | | |
|---|---|---|---|
| 5,568,467 A * | 10/1996 | Inagaki et al. | 369/47.43 |
| 5,887,090 A | 3/1999 | Rudolph et al. | 385/24 |
| 6,064,586 A | 5/2000 | Snyder et al. | 365/125 |
| 6,285,474 B1 * | 9/2001 | Kawano et al. | 359/29 |
| 7,324,249 B2 * | 1/2008 | Uchida et al. | 359/22 |
| 2002/0114027 A1 * | 8/2002 | Horimai | 359/11 |
| 2005/0111327 A1 * | 5/2005 | Erickson et al. | 369/53.22 |
| 2005/0286387 A1 | 12/2005 | Ayres et al. | 369/103 |

FOREIGN PATENT DOCUMENTS

WO    WO 2005103842 A2 *    11/2005

* cited by examiner

*Primary Examiner*—Wayne R Young
*Assistant Examiner*—Nathan A Danielsen
(74) *Attorney, Agent, or Firm*—Kunzler Needham Massey & Thorpe

(57) ABSTRACT

An apparatus, system, and method are disclosed for calibrating a holographic storage device. A read channel reads a factory-stored hologram from a holographic media. A calculation module calculates a read difference between the read factory-stored hologram and a first holographic pattern that digitally describes the factory-stored hologram. In one embodiment, a calibration module calibrates the read channel with the read difference.

33 Claims, 10 Drawing Sheets

APPARATUS, SYSTEM, AND METHOD FOR CALIBRATING A HOLOGRAPHIC STORAGE DEVICE

BACKGROUND OF THE INVENTION

1. Field of the Invention

This invention relates to holographic storage devices and more particularly relates to calibrating holographic storage devices.

2. Description of the Related Art

Data processing systems are storing ever-larger quantities of data. To meet this increasing demand, storage device manufacturers are increasing the areal densities of magnetic storage devices, optical storage devices, and the like. Unfortunately, limitations such as material limitations, paramagnetic limits, limitations on the wavelengths of available lasers, and the like may restrict future increases in areal densities.

Holographic storage may support increased data storage densities, providing a technology to support the increasing demand for storage. However, to be a viable storage technology, holographic storage media must be interchangeable among a plurality of holographic storage devices, including different models of holographic storage devices and devices from different manufacturers.

For example, a first holographic storage device must be able to write data to a storage media that can be read by a second holographic storage device. In addition, if the second holographic storage device writes additional data to the storage media, the first holographic storage device must be able read the additional data from the storage media. Similarly, a third holographic storage device must be able to successfully read all data written by both the first and the second holographic storage devices.

Unfortunately, a holographic storage device may be sufficiently sensitive to differences between data written by the holographic storage device and data written by other holographic storage devices that interoperability is compromised. For example, a first and second holographic storage device produced by different manufacturers may each be unable to read data written by the other because of read and write channel sensitivities.

SUMMARY OF THE INVENTION

From the foregoing discussion, there is a need for an apparatus, system, and method that calibrate a holographic storage device. Beneficially, such an apparatus, system, and method would allow interoperability between a plurality of holographic storage devices.

The present invention has been developed in response to the present state of the art, and in particular, in response to the problems and needs in the art that have not yet been fully solved by currently available holographic storage device calibration methods. Accordingly, the present invention has been developed to provide an apparatus, system, and method for calibrating a holographic storage device that overcome many or all of the above-discussed shortcomings in the art.

The apparatus to calibrate a holographic storage device is provided with a plurality of modules configured to functionally execute the steps of reading a factory-stored hologram from a holographic media and calculating a read difference between the read factory-stored hologram and a first holographic pattern. These modules in the described embodiments include a read channel and a calculation module. The apparatus may also include a calibration module and a write channel.

The read channel reads a factory-stored hologram from a holographic media. In one embodiment, the factory-stored hologram is precision written on the holographic media. The factory-stored hologram may reside on a read-only portion of the holographic media. Alternatively, the factory-stored hologram may be inserted in the holographic media as the read-only portion.

The calculation module calculates a read difference between the read factory-stored hologram and a first holographic pattern. The first holographic pattern digitally describes the factory-stored hologram. In one embodiment, the calculation module calculates the read difference as a plurality of differences between corresponding data elements of the factory-stored hologram and the first holographic pattern.

In one embodiment, the calibration module calibrates the read channel with the read difference. The calibration module may calibrate the read channel by detecting a pattern in the read difference and adjusting the read channel to mitigate the pattern.

In one embodiment, the write channel writes a second holographic pattern to the holographic media as a second hologram. The second holographic pattern may digitally describe the second hologram. The write channel may only write the second holographic pattern after a read workload is complete and if and only if there is a pending write workload.

If the read workload is complete and if and only if there is the pending write workload, the read channel may read the second hologram from the holographic media with the calibrated read channel. In addition, the calculation module may calculate a write difference between the read second hologram and the second holographic pattern.

In one embodiment, the calibration module calibrates the write channel with the write difference. The calibration module may calibrate the write channel by detecting a pattern in the write difference and adjusting the write channel to mitigate the pattern. The apparatus calculates the read difference for the read channel using the factory-stored hologram. In addition, the apparatus may calibrate the read channel using the read difference. The apparatus may also calculate the write difference for the write channel and calibrate the write channel.

A system of the present invention is also presented to calibrate a holographic storage device. The system may be embodied in a holographic storage device. In particular, the system, in one embodiment, includes a holographic media, a read channel, and a processor. In addition, the system may also include a write channel.

The holographic media is configured to store digital data. In addition, the holographic media includes a factory-stored hologram. The read channel reads digital data from a hologram stored in the holographic media. The write channel may write digital data in the form of a hologram to the holographic media.

The read channel reads the factory-stored hologram from the holographic media. The processor includes a calculation module and a calibration module. The calculation module calculates a read difference between the read factory-stored hologram and a first holographic pattern. The calibration module calibrates the read channel with the read difference. The system calculates the read difference and may calibrate the read channel using the read difference. In addition, the system may calculate a write difference and calibrate the write channel using the write difference.

A method of the present invention is also presented for calibrating a holographic storage device. The method in the disclosed embodiments substantially includes the steps to carry out the functions presented above with respect to the operation of the described apparatus and system. In one embodiment, the method includes reading a factory-stored hologram from a holographic media and calculating a read difference between the read factory-stored hologram and a first holographic pattern. The method also may include writing a second holographic pattern to the holographic media as a second hologram, reading the second hologram, and calculating a write difference.

A read channel reads a factory-stored hologram from a holographic media. A calculation module calculates a read difference between the read factory-stored hologram and a first holographic pattern that digitally describes the factory-stored hologram. In a certain embodiment, a calibration module calibrates the read channel with the read difference.

In one embodiment, if a read workload is complete and if and only if there is a pending write workload, a write channel writes a second holographic pattern to the holographic media as a second hologram. In addition, the read channel may read the second hologram from the holographic media with the calibrated read channel and the calculation module may calculate a write difference between the read second hologram and the second holographic pattern. The calibration module may further calibrate the write channel with the write difference. The method may calibrate the read and write channels for a holographic storage device.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The embodiment of the present invention calculates a read difference using a factory-stored hologram. In addition, the present invention may calibrate the read channel with the read difference. The present invention may also calculate a write difference and calibrate a write channel with the write difference. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
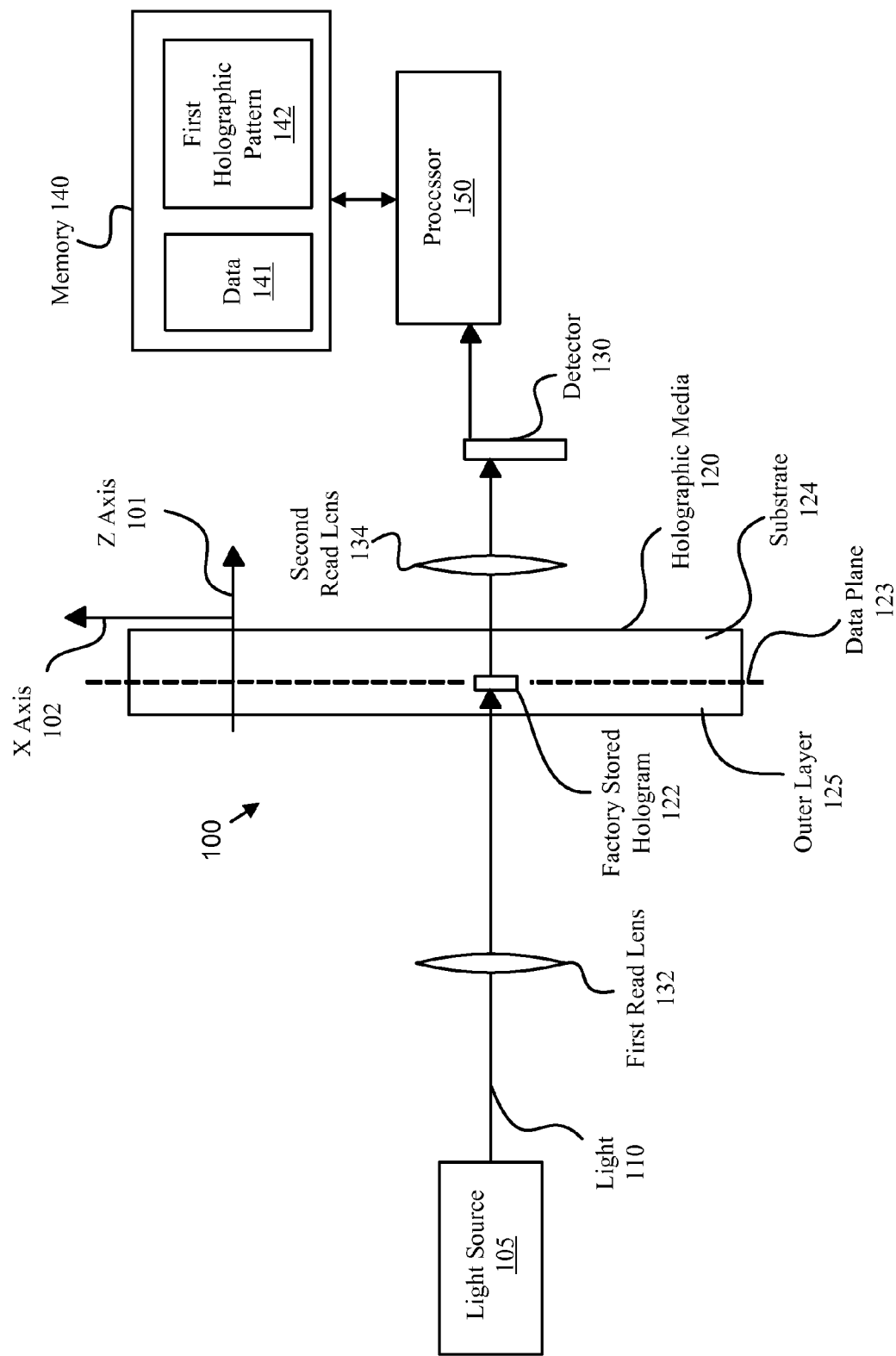
FIG. 1 is a schematic block diagram illustrating one embodiment of a read channel reading a factory-stored hologram of the present invention.

FIG. 1 is a schematic block diagram illustrating one embodiment of a read channel 100 reading a factory-stored hologram 122 of the present invention. The read channel 100 includes a light source 105, a first read lens 132, a holographic media 120, a second read lens 134, a detector 130, a processor 150, and a memory 140. The holographic media 120 further includes an outer layer 125, a data plane 123, and a substrate 124.

The outer layer 125 may be configured to transmit light within one or more specified ranges of wavelengths. The data plane 123 may be configured to record holographic data as holographic diffractive volume gratings throughout the volume of the data plane 123. The substrate 124 may be configured to support the data plane 123 and the outer layer. In one embodiment, the substrate transmits light 110. Alternatively, the substrate 124 may reflect light 110.

In addition, the holographic media 120 further includes a factory-stored hologram 122. The factory-stored hologram 120 comprises holographic diffractive volume gratings that encode data. In one embodiment, an array of diffractive volume gratings comprises an array of data elements such as pixels.

The holographic media 120 rotates about a virtual Z-axis 101. A virtual X axis 102 is also shown, while a virtual Y axis is perpendicular to the X axis 102 and the Z axis 101, and so is not shown. In one embodiment, the virtual Y axis extends from the page. The light source 105 produces a beam of light 110. In one embodiment, the light source 105 is a laser and the light 110 is coherent light. In a certain embodiment, the light 110 is in the range of two hundred to 700 hundred nanometers (200-700 nm). In a particular embodiment, the light 110 is in the range of two hundred to five hundred nanometers (200-500 nm).

The first read lens 132 may focus the light 110 on the data plane 123 of the holographic media 120. In one embodiment, the first read lens 132 and the focus of the light 110 are adjusted by one or more actuators as are well known to those of skill in the art.

In the depicted embodiment, the focused light 110 is transmitted through outer layer 125 of the holographic media 120 and is modified by the holographic diffractive volume gratings of the data plane 123. The second read lens 134 may focus the modified light 110 on the detector 130. In one embodiment, one or more actuators adjust the position of the second read lens 134 and the focus of the light 110. The detector 130 receives the modified light 110. The detector 130 may be an array of light sensitive semiconductor elements such as a charge-coupled detector (CCD) array of semiconductor elements as is well know to those of skill in the art. Alternatively, the detector 130 may be configured as a charge-integrating array (CID).

The light 110 diffracts off the diffractive volume gratings of the factory-stored hologram 122 forming a pixilated pattern on the detector 130. The detector 130 may record the pixilated pattern as a data array. The processor 150 may read the data array from the detector 130 and store the data array in the memory 140 as data 141. The memory 140 may also store a first holographic pattern 142 as will be described hereafter. The first holographic pattern 142 digitally describes the factory-stored hologram 122.

Figure 2A:
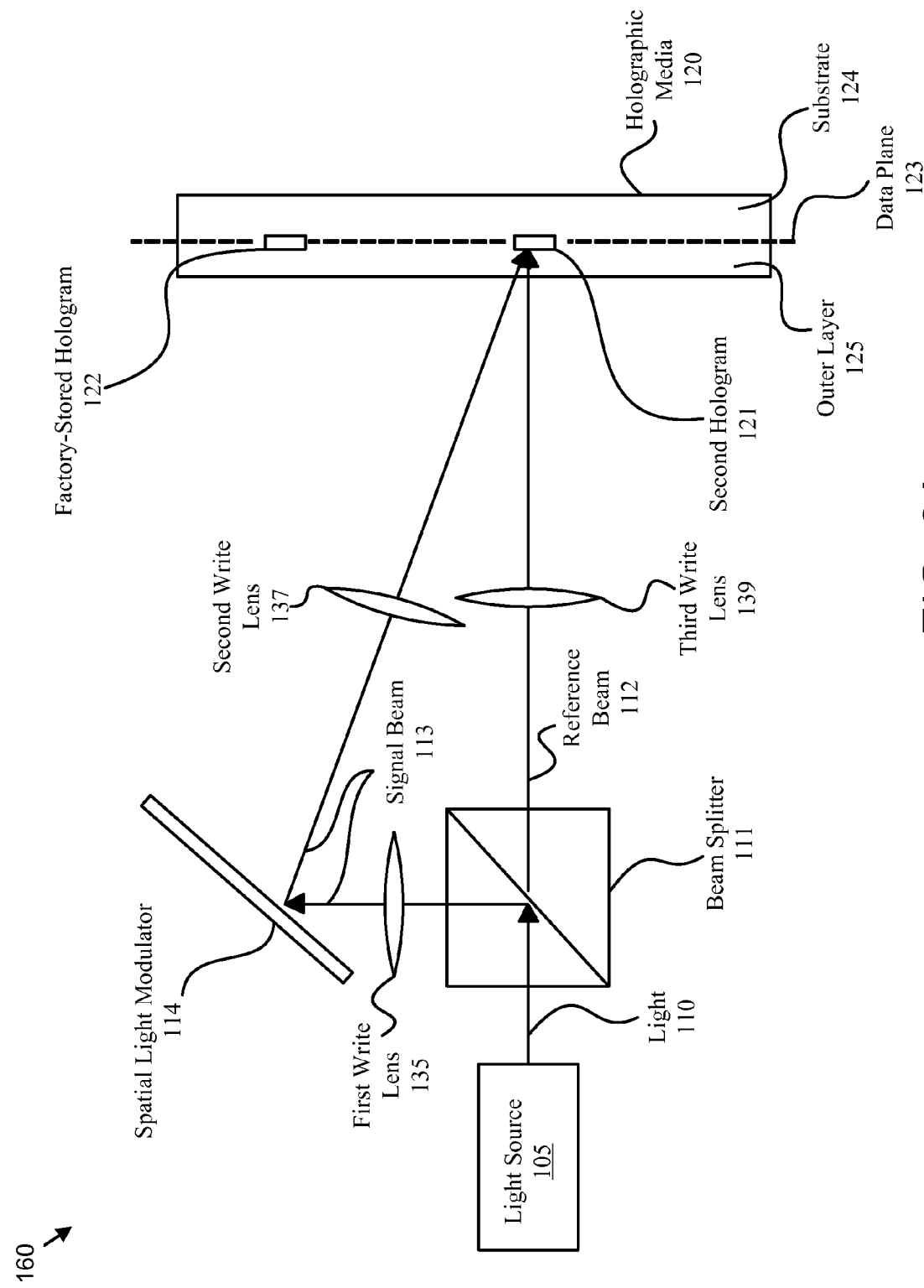
FIG. 2A is a schematic block diagram illustrating one embodiment of a write channel of the present invention.

FIG. 2A is a schematic block diagram illustrating one embodiment of a write channel 160 of the present invention. The write channel 160 includes elements of the read channel 100 of FIG. 1, like numbers referring to like elements. In addition, the write channel 160 includes a beam splitter 111, a first write lens 135, a spatial light modulator 114, a second write lens 137, and a third write lens 139.

The beam splitter 111 splits the light 110 into a reference beam 112 and a signal beam 113. The third write lens 139 may focus the reference beam 112 on the data plane 123 of the holographic media 120. One or more actuators may adjust the position of the third write lens 139 and the focus of the reference beam 112. The focused reference beam 112 proceeds to the holographic media 120. The first write lens 135 may focus the signal beam 113 onto the spatial light modulator 114. One or more actuators may adjust the position of the first write lens 135 and the focus of the signal beam 113.

The spatial light modulator 114 modulates the signal beam 113. The spatial light modulator 114 is depicted as a reflective spatial light modulator. In one embodiment, the spatial light module is configured as an array micromechanical mirrors that may be positioned in either a reflective position or a non-reflective position. Electronic signals from the processor 150 may dictate the position of each micromechanical mirror.

In an alternative embodiment, the spatial light modulator 114 may be configured as a liquid-crystal-on-silicon (LCOS) semiconductor device. Electronic signal from the processor 150 may polarize or un-polarize liquid crystal cells of the semiconductor device. The signal beam 113 may pass through a liquid crystal cell if the cell is un-polarized, reflect off a substrate, and continue to the holographic media 120.

The spatial light modulator 114 encodes the signal beam 113 with a pixilated data array. The second write lens 137 focuses the encoded signal beam 113 on the dataplane 123 of the holographic media 120. One or more actuators may adjust the second write lens 137 and the focus of the signal beam 113 at the data plane 123. At the data plane 123 of the holographic media 120, the signal beam 113 interferes with the reference beam 112, creating holographic diffractive volume gratings that store the pixilated data array on the holographic media 120. In the depicted embodiment, the write channel 160 is shown writing a second hologram 121 that will be described hereafter.

Figure 2B:
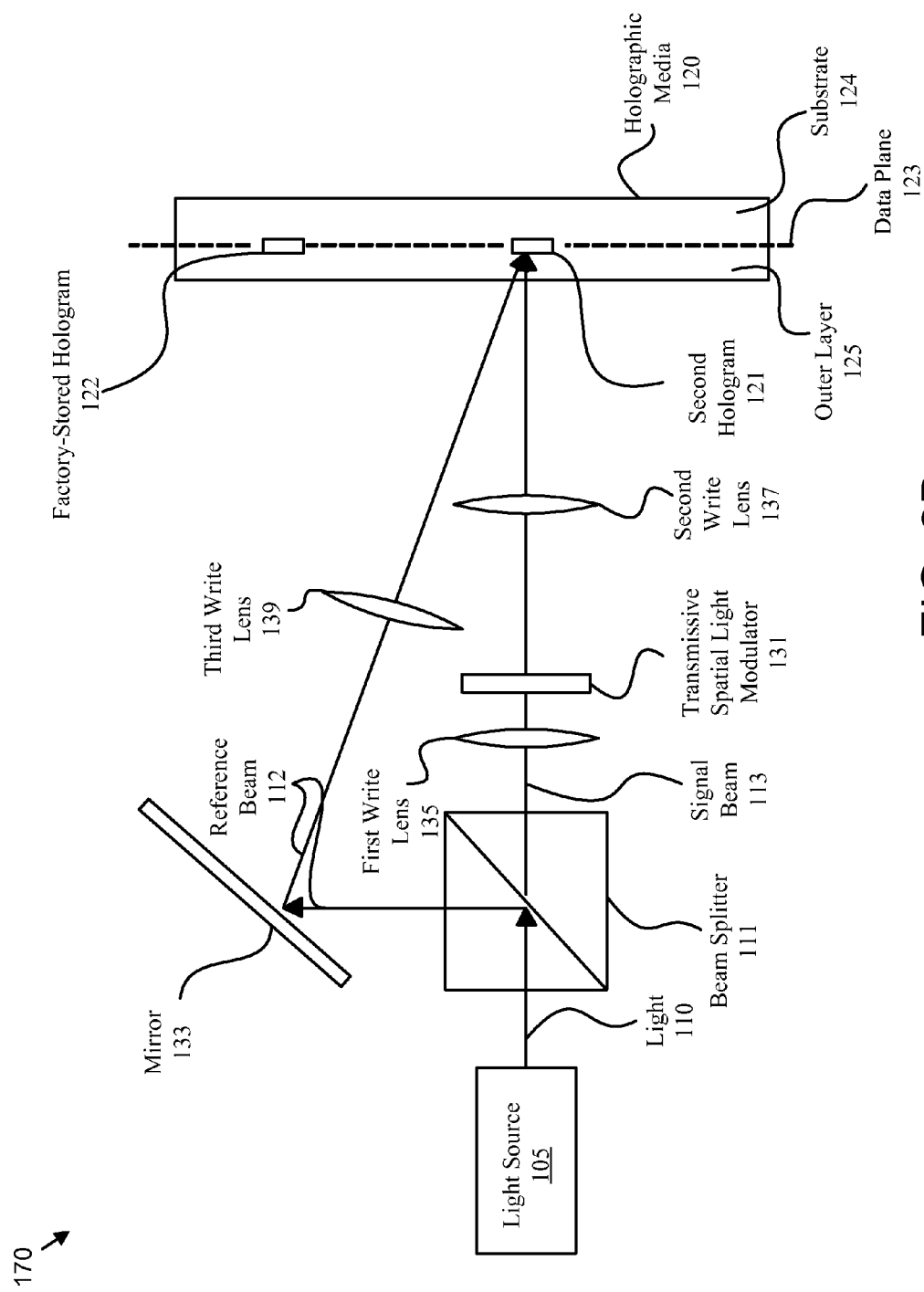
FIG. 2B is a schematic block diagram illustrating one alternate embodiment of a write channel of the present invention.

FIG. 2B is a schematic block diagram illustrating one alternate embodiment of a write channel 170 with a transmissive spatial light modulator 131. The write channel 170 includes many of the elements of FIG. 2A, like numbers referring to like elements. The write channel 170 also includes the transmissive spatial light modulator 131 and a mirror 133.

The beam splitter 111 splits the light 110 into the reference beam 112 and the signal beam 113. The mirror 133 redirects the reference beam 112 to the holographic media 120. The third write lens 139 may focus the reference beam 112 on the on the data plane 123 of the holographic media 120. One or more actuators may adjust the position of the third write lens 139 and the focus of the reference beam 112. The focused reference beam 112 proceeds to the holographic media 120.

The first write lens 135 may focus the signal beam 113 onto the transmissive spatial light modulator 131. One or more actuators may adjust the position of the first write lens 135 and the focus of the signal beam 113. The transmissive spatial light modulator 131 modulates the signal beam 113. In the depicted embodiment, the transmissive spatial light modulator 131 is a LCOS semiconductor device. The signal beam 113 may pass through a liquid crystal cell if the cell is unpolarized and continue to the holographic media 120. The second write lens 137 focuses the encoded signal beam 113 on the data plane 123 of the holographic media 120. One or more actuators may adjust the second write lens 137 and the focus of the signal beam 113 at the data plane 123.

The signal beam 113 interferes with the reference beam 112, creating holographic diffractive volume gratings that store the pixilated data array on the holographic media 120 as described for FIG. 2A. In the depicted embodiment, the write channel 170 is shown writing the second hologram 121.

Figure 3:
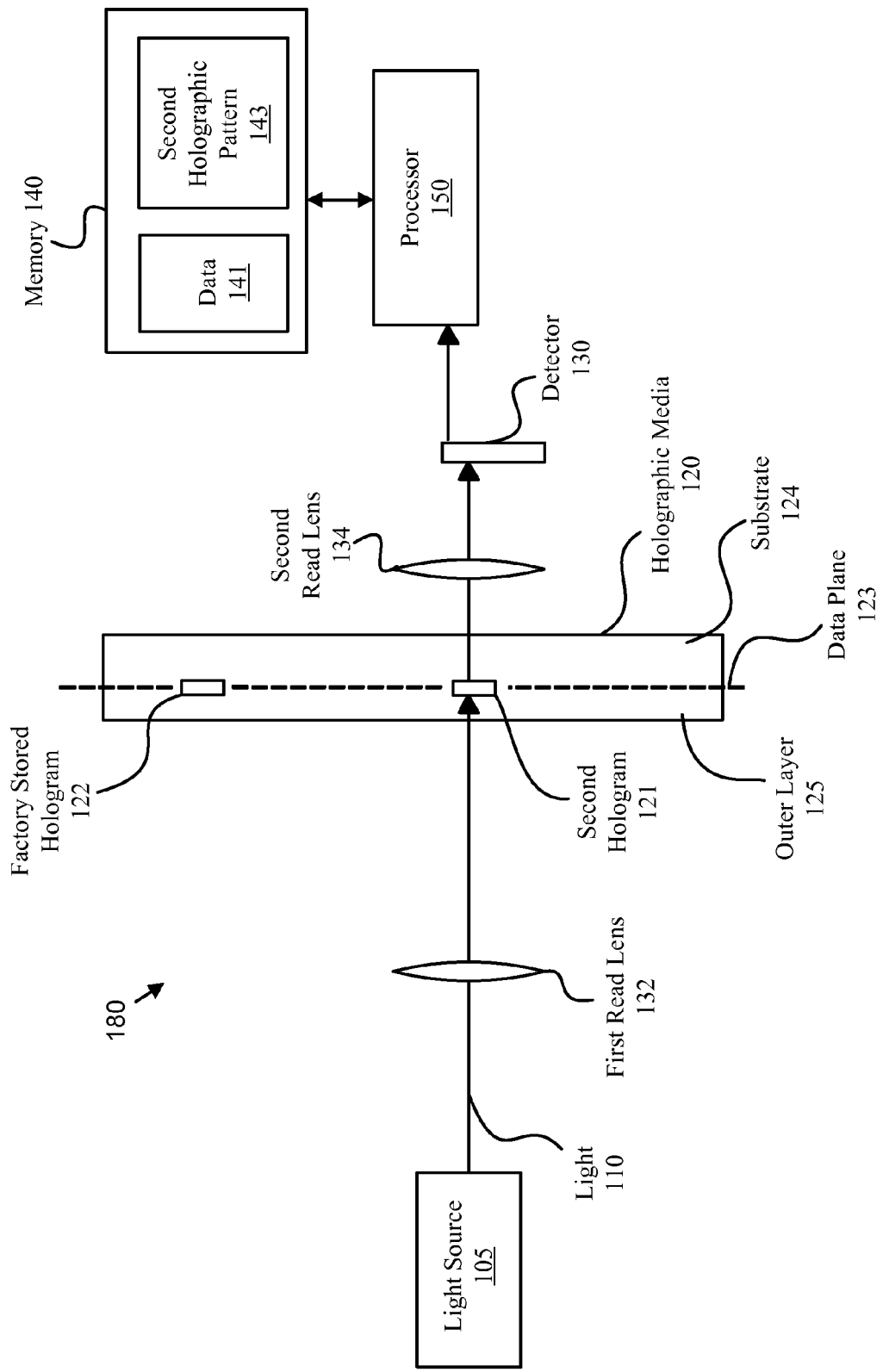
FIG. 3 is a schematic block diagram illustrating one embodiment of a calibrated read channel of the present invention.

FIG. 3 is a schematic block diagram illustrating one embodiment of a calibrated read channel 180 of the present invention. The calibrated read channel 180 includes the elements of the read channel 100 of FIG. 1. The read channel 100 is calibrated using the factory-stored hologram 122 as will be described hereafter.

The calibrated read channel 180 is shown reading the second hologram 121 of FIG. 2. The memory 140 may store the data of the second hologram 121 as data 141. The memory is also shown storing a second holographic pattern 143. The second holographic pattern 143 digitally describes the second hologram 121.

Figure 4:
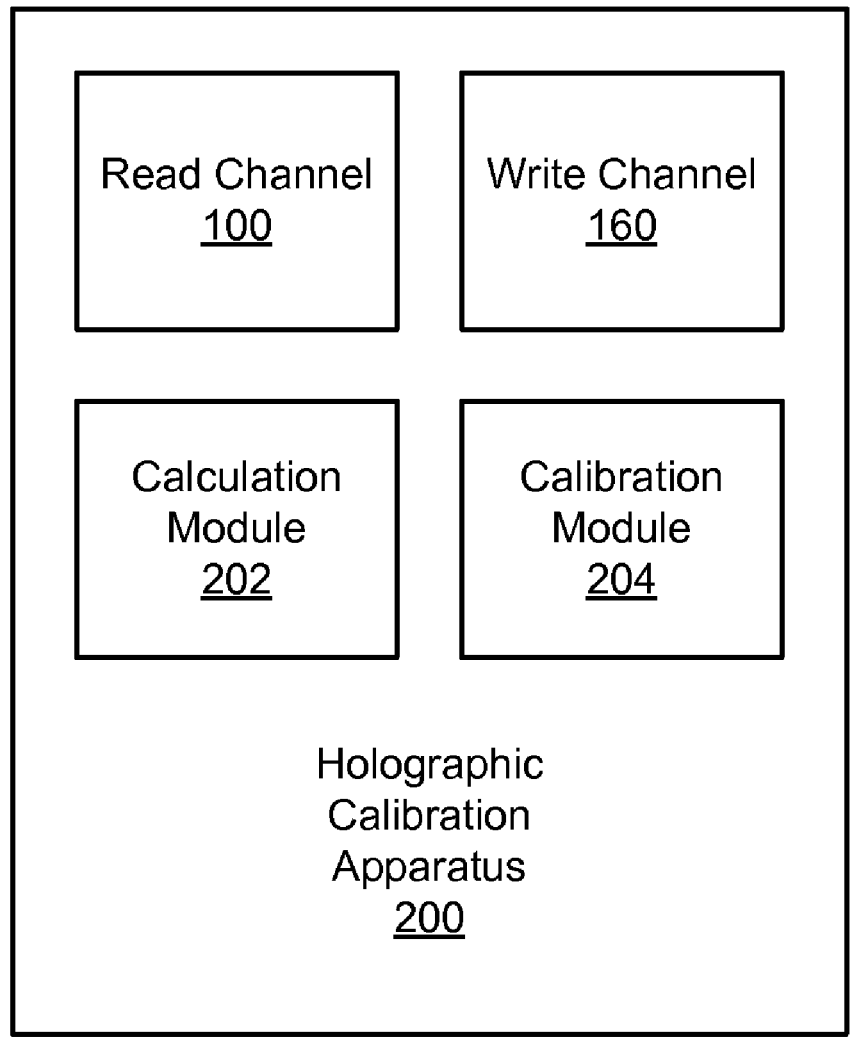
FIG. 4 is a schematic block diagram illustrating one embodiment of a holographic calibration apparatus of the present invention.

FIG. 4 is a schematic block diagram illustrating one embodiment of a holographic calibration apparatus 200 of the present invention. The description of the apparatus refers to elements of FIGS. 1-3, like numbers referring to like elements. The apparatus 200 includes the read channel 100, the write channel 160, a calculation module 202, and a calibration module 204. In one embodiment, one or more software processes and one or more data sets stored in the memory 140 and executed and/or used by the processor embody the calculation module 202 and calibration module 204. Although either the reflective write channel 160 or the transmissive write channel 170 may be employed, hereafter for simplicity the reflective write channel 160 will be referred to as the write channel 160.

The read channel 100 reads the factory-stored hologram 122 from the holographic media 120. In one embodiment, the factory-stored hologram 122 is precision written on the holographic media 120. The factory-stored hologram 122 may be precision written using a stable reference write channel. The reference write channel may be contained in an environmental chamber set to nominal temperature and humidity. In addition, the reference write channel's components may be selected to nominal values. The reference write channel may also be regularly calibrated to a specified standard such as the factory-stored hologram 122.

The factory-stored hologram 122 may reside on a read-only portion of the holographic media as will be described hereafter. Alternatively, the factory-stored hologram 122 may be inserted in the holographic media 120 as the read-only portion as will also be described hereafter.

The calculation module 202 calculates a read difference between the read factory-stored hologram 122 and the first holographic pattern 142. In one embodiment, the calculation module 202 calculates the read difference as a plurality of differences between corresponding data elements from the factory-stored hologram 122 that are stored as data 141 in the memory 140 and the first holographic pattern 142 stored in the memory 140.

In a certain embodiment, the calibration module 204 calibrates the read channel 100 with the read difference. The calibration module 204 may calibrate the read channel 100 by detecting a pattern in the read difference and adjusting the read channel 100 to mitigate the pattern. Such read calibration adjustment may include the read power-level of light source 105, the duration of the read laser light burst, adjusting the first and second read lenses 132, 134, and the sensitivity of detector 130.

In one embodiment, the write channel 160 writes the second holographic pattern 143 to the holographic media 120 as a second hologram 121. The write channel 160 may only write the second holographic pattern 143 after a read workload is complete and if and only if there is a pending write workload. As used herein, the read workload comprises one or more data elements that are to be read by the read channel 100 from the holographic media 120 while the write workload comprises one or more data elements that are to be written to the holographic media 120 by the write channel 160.

The calibrated read channel 180 may read the second hologram 121 from the holographic media 120. In addition, the calculation module 202 may calculate a write difference between the read second hologram 121 and the second holographic pattern 143. In one embodiment, the calibration module 204 calibrates the write channel 160 with the write difference. The calibration module 204 may calibrate the write channel 160 by detecting a pattern in the write difference and adjusting the write channel 160 to mitigate the pattern. The apparatus 200 calculates the read difference for the read channel 100 using the factory-stored hologram 122. In addition, the apparatus 200 may calibrate the read channel 100 using the read difference. The apparatus 200 may also calculate the write difference for the write channel and calibrate the write channel 160. Such write calibration adjustments may include the write power-level of light source 105, the duration of the write laser light burst, and adjusting the write lenses 135, 137, 139 and the sensitivity of detector 130.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 5:
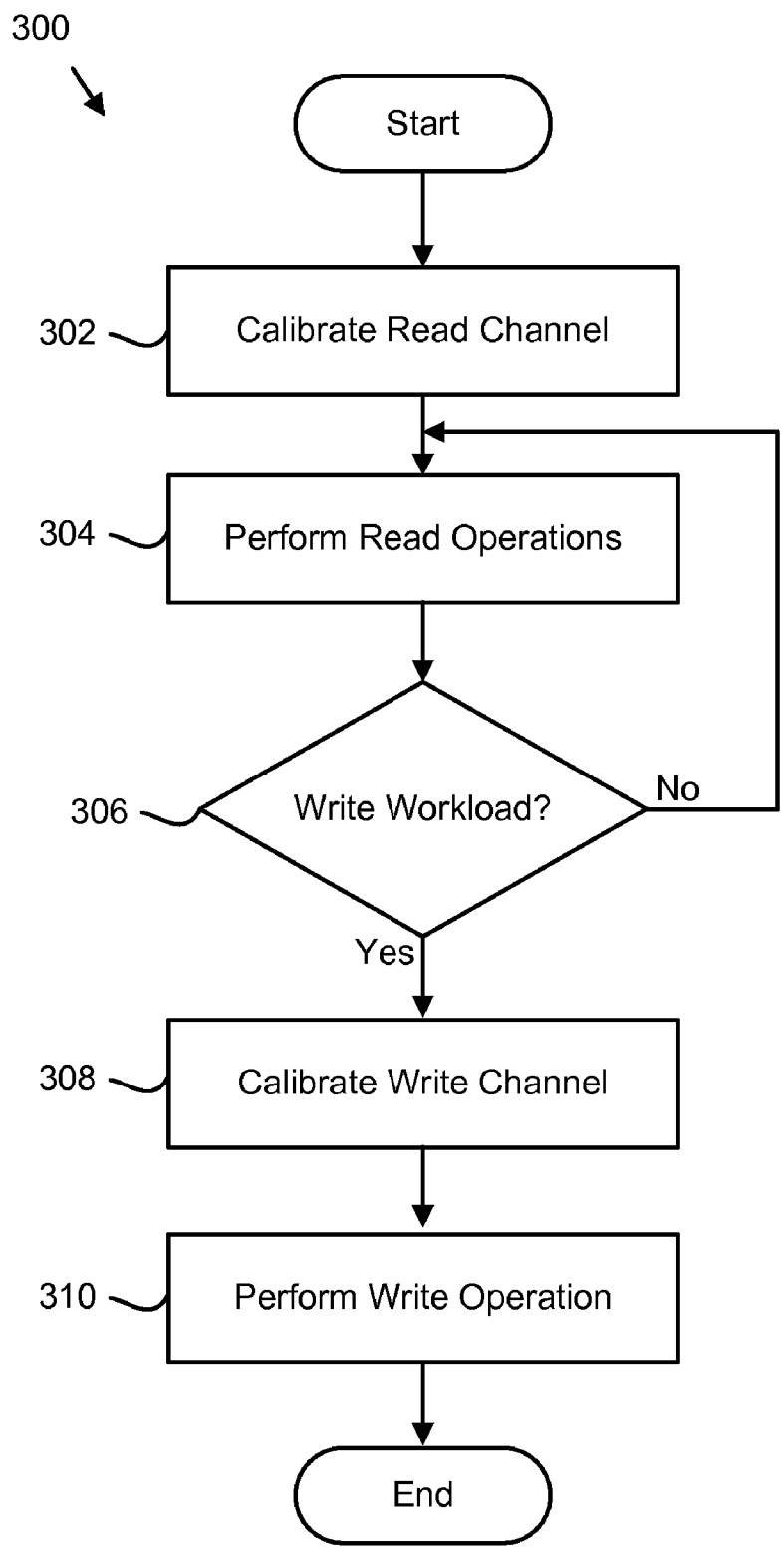
FIG. 5 is a schematic flow chart diagram illustrating one embodiment of a holographic calibration method of the present invention.

FIG. 5 is a schematic flow chart diagram illustrating one embodiment of a holographic calibration method 300 of the present invention. The method 300 substantially includes the steps to carry out the functions presented above with respect to the operation of the described apparatus 200, read channels 100, 180, and write channel 160 of FIGS. 1-4. The description of the method 300 refers to elements of FIGS. 1-4, like numbers referring to like elements.

The method 300 begins and the holographic calibration apparatus 200 calibrates 302 the read channel 100 using the factory-stored hologram 122 as will be described hereafter. Calibrating 302 the read channel 100 makes the read channel 100 a calibrated read channel 180. The calibrated read channel 180 may perform 304 read operations, reading data elements from the holographic media 120.

The processor 150 determines 306 if there is a write workload to write to the holographic media 120. If the processor 150 determines 306 that there is no write workload, the calibrated read channel 180 continues performing 304 read operations until the holographic media is removed from the holographic storage device.

If the processor 150 determines 306 that there is a write workload, the calibration module 204 calibrates 308 the write channel 160 as will be described hereafter. The write channel 160 may then perform 310 write operations, writing data elements to the holographic media 120, and the method 300 terminates.

The method 300 allows holographic media 120 to be used interoperably between a plurality of holographic storage devices by calibrating each holographic storage device to the factory-stored hologram 122. Because the calibrated read channel 180 is calibrated to the factory-stored hologram 122, the calibrated read channel 180 may successfully read data-encoded holograms written by write channels 160 that are calibrated using the factory-encoded hologram 122 as will be described hereafter. Similarly, because the write channel 160 is calibrated to the factory-stored hologram 122, data-encoded holograms written by the write channel 160 may be read by other calibrated read channels 180 that are calibrated with the factory-stored hologram 122.

Figure 6:
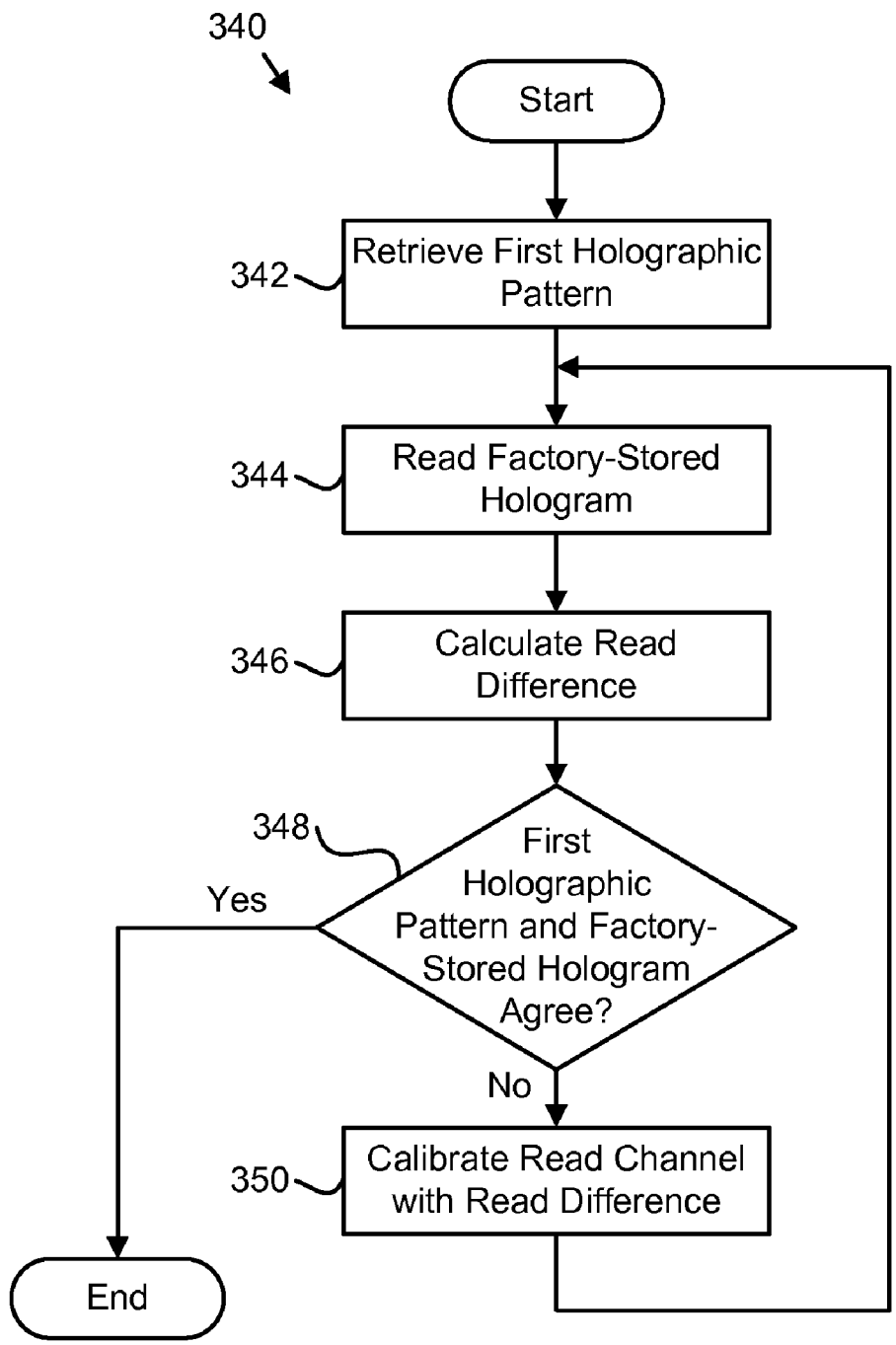
FIG. 6 is a schematic flow chart diagram illustrating one embodiment of a read calibration method of the present invention.

FIG. 6 is a schematic flow chart diagram illustrating one embodiment of a read calibration method 340 of the present invention. The method 340 substantially includes the steps to carry out the function of step 302 of FIG. 5. In addition, the description of the method 340 refers to elements of FIGS. 1-5, like numbers referring to like elements. A read channel calibration software process executing on the processor 150 may embody the method 340.

The method 340 begins and in one embodiment, the processor 150 retrieves 342 the first holographic pattern 142 from the memory 140. The read channel 100 reads 344 the factory-stored hologram 122 from a holographic media 120 and stores the read factory-stored hologram 122 as data 141 in the memory 140. In one embodiment, the processor 150 directs the read channel 100 to read 344 the factory-stored hologram 122.

The factory-stored hologram 122 may reside on a specified portion of the holographic media 120. Alternatively, a header may designate the factory-stored hologram 122. Thus the processor 150 may direct the read channel 100 to read the holographic media 120 until the header of the factory-stored hologram 122 is located. The read channel 100 may then read 344 the factory-stored hologram 122.

The calculation module 202 calculates 346 a read difference between the read factory-stored hologram 122 and the first holographic pattern 142. In one embodiment, the calculation module 202 may calculate 346 the read difference from errors detected while decoding the data of the read factory-stored hologram 122 encoded with an error correction code (ECC). The ECC may encode the data of the read factory-stored hologram 122 and the first holographic pattern 142 using specified rules of construction such that errors in the data may be detected and corrected. Examples of ECC include but are not limited to Hamming code, Reed-Solomon code, Reed-Muller code, Binary Golay code, convolutional code, and turbo code. The calculation module 202 may calculate 346 the read difference as one or more data errors in the read factory-stored hologram 122 that are identified while decoding the ECC-encoded data.

In a certain embodiment, the read difference may be based on a circular redundancy check (CRC) code encoding both the read factory-stored hologram 122 and the first holographic pattern 142. The data of the read factory-stored hologram 122 and the first holographic pattern 142 may be organized as a plurality of data words. Each data word may be encoded with redundant data using a CRC algorithm to form a unique encoded word as is well known to those of skill in the art. If data bits of the factory-stored hologram 122 are read incorrectly, the error may be detected and/or corrected using a CRC algorithm that decodes the CRC-encoded data. The calculation module 202 may record each error as the read difference. In one embodiment, the calculation module 202 maps the locations of errors with the data of the factory-stored hologram 122 as part of the read difference.

Alternatively, the calculation module 202 calculates 346 the read difference as a bit by bit comparison of corresponding bits from the read factory-stored hologram 122 and the first holographic pattern 142. For example, the calculation module 202 may compare the data of the read factory-stored hologram 122 and the first holographic pattern 142 and map each difference as the read difference.

In one embodiment, the calculation module 202 calculates 346 the read difference as the difference between the factory-stored hologram 122 $g(x,y)$ read from the holographic media 120 and a matched filter matched to the impulse response $h(x,y)=s^*(-x,-y)$ of the first holographic pattern 142 as shown in eqn.[1], where $V(x,y)$ is the cross-correlation between the factory-stored hologram 122 $g(x,y)$ and the first holographic pattern 142 $s(x,y)$. Eqn.[1] comprises a double integral, meaning that the integration is over the X axis 102 and Y axis directions of the detector 130. Additionally, $\xi$ is the integration variable along the X axis 102, $\eta$ is the integration variable along the Y axis, and * denotes a complex conjugate.

$$V(x,y)=\iint g(\xi,\eta)s^*(\xi-x,\eta-y)]d\xi d\eta \qquad \text{Eqn. [1]}$$

Mathematically, $V(x,y)$ is a surface varying along the X axis 102 and the Y axis, for each $(x,y)$. There is one value of $V(x,y)$ for each detector element in detector 130. The range of $V(x,y)$ for each $(x,y)$ is between $-1$ and $+1$, where $+1$ represents the ideal correlation of one hundred (100%). To maximize $V(x,y)$, the following difference surface, Difference(x, y), is defined in Eqn.[2]. As shown, Difference(x,y) is calculated by subtracting the matched filter correlation $V(x,y)$ from unity. Difference(x,y) may be evaluated (a) point-to point, (b) as an arithmetic mean, (c) as a geometric mean, and (d) as a root-mean-square. Difference(x,y) ranges between 0 and +2, and the ideal difference for each value of $(x,y)$ is 0, meaning for a value of 0 that there is no difference between the factory-stored hologram 122 read from the holographic media 120 and the first holographic pattern 142 at that point $(x,y)$. Difference(x,y) may be evaluated point-by-point in read difference calculations, but it may be advantageous to quantify surface Difference(x,y) in terms of a single number, to simply read difference calculations. Such single numbers may be MAX_Difference, which is equal to the maximum value of Difference(x,y). Alternately AM_Difference, the arithmetic mean of the values of Difference(x,y), GM_Difference, the geometric mean of the values of Difference(x,y), or RMS_Difference, the root-mean-square of the values of Difference(x,y) may be used in the read difference calculations.

$$\text{Difference}(x,y) = 1 - V(x,y) \quad \text{Eqn.[2]}$$

In an alternate embodiment, the calculation module 202 calculates 346 the read difference for a plurality of read power levels for the light source 105 and durations of the light source read light-burst. In a certain embodiment, the calculation module 202 calculates 348 a read difference for each element of matrix m as shown in eqn. (2), where p is a base read power level, d is a base light source read light-burst duration, Δp is difference of the base read power level, and Δd is a difference of the base light source read light-burst duration. In one embodiment, Δp is in the range of one to fifteen percent (1-15%) of the base read power p. Similarly, Δd may be in the range of one to fifteen percent (1-15%) of the base light source read light-burst duration d. Although for simplicity matrix m of eqn.[3] is shown as a 3×3 matrix, m may be of any dimensions.

$$m = \begin{bmatrix} p-\Delta p, d-\Delta d & p-\Delta p, d & p-\Delta p, d+\Delta d \\ p, d-\Delta d & p, d & p, d+\Delta d \\ p+\Delta p, d-\Delta d & p+\Delta p, d & p+\Delta p, d+\Delta d \end{bmatrix} \quad \text{Eqn. [3]}$$

The calculation module 202 determines 348 if the read factory-stored hologram 122 and the first holographic pattern 142 agree. In one embodiment, the calculation module 202 determines 348 that the read factory-stored hologram 122 and the first holographic pattern 142 agree if errors detected while decoding an ECC or CRC encoding of the data of the factory-stored hologram 122 are less than a specified threshold. For example, if the specified threshold is ten (10) errors and the calculation module 202 detected twelve (12) errors in the ECC encoded data, the calculation module 202 may determine 348 that the read factory-stored hologram 122 and the first holographic pattern 142 do not agree. In one embodiment, the use of ECC or CRC encoded data in the factory-stored hologram 122 makes storing the first holographic pattern 142 unnecessary.

Alternatively, the calculation module 202 may determine 348 that the read factory-stored hologram 122 and the first holographic pattern 142 agree if V(x,y), the cross-correlation between the factory-stored hologram 122 and the first holographic pattern 142 as calculated with eqn.[1], is less than a specified correlation threshold. If the read factory-stored hologram 122 and the first holographic pattern 142 agree, the read channel 100 is already calibrated as a calibrated read channel 180 and the method 340 terminates.

If calculation module 202 determines 348 that the read factory-stored hologram 122 and the first holographic pattern 142 do not agree, the calibration module 204 may calibrate 350 the read channel 100 using the read difference. The calibration module 204 may detect a pattern in the read difference. In addition, the calibration module 204 may adjust one or more elements of the read channel 100 to mitigate the pattern. For example, a two-dimensional data array of the factory-stored hologram 122 may be offset by a column from a two-dimensional data array of the first holographic pattern 142. The calibration module 204 may adjust the timing of reading the factory-stored hologram 122 to mitigate the offset pattern, so that when the read channel 100 reads 344 the factory-stored hologram 122, the two-dimensional data array of the factory-stored hologram 122 is equivalent to the two-dimensional array of the first holographic pattern 142.

The calibration module 204 may make other read calibration adjustments, including the read power-level of light source 105, the duration of the read light source light-burst, adjusting the read lenses 132, 134, and the sensitivity of detector 130. In one example, the calibration module 204 may set the power level of the light source 110 and the duration of the light source light-burst to the values of matrix m of eqn.[3] with the smallest read difference.

In an alternate example, the calibration module 204 may detect a pattern in the read difference of data in the center of the data array of the factory-stored hologram 122 being different from data in the center of the data array of the first holographic pattern 142. The calibration module 204 may adjust the focus of the light source 105 by positioning the read lenses 132, 134 to mitigate the pattern in the read difference.

After the calibration module 204 calibrates 350 the read channel 100, the processor 150 may direct the read channel 100 to read 344 the factory-stored hologram 122 and the calculation module 202 again determines 346 if the read factory-stored hologram 122 and the first holographic pattern 142 agree. The method 340 may iteratively calculate 348 the read difference and calibrate 350 the read channel 100 until the read channel 100 is calibrated 350 as a calibrated read channel 180.

Figure 7:
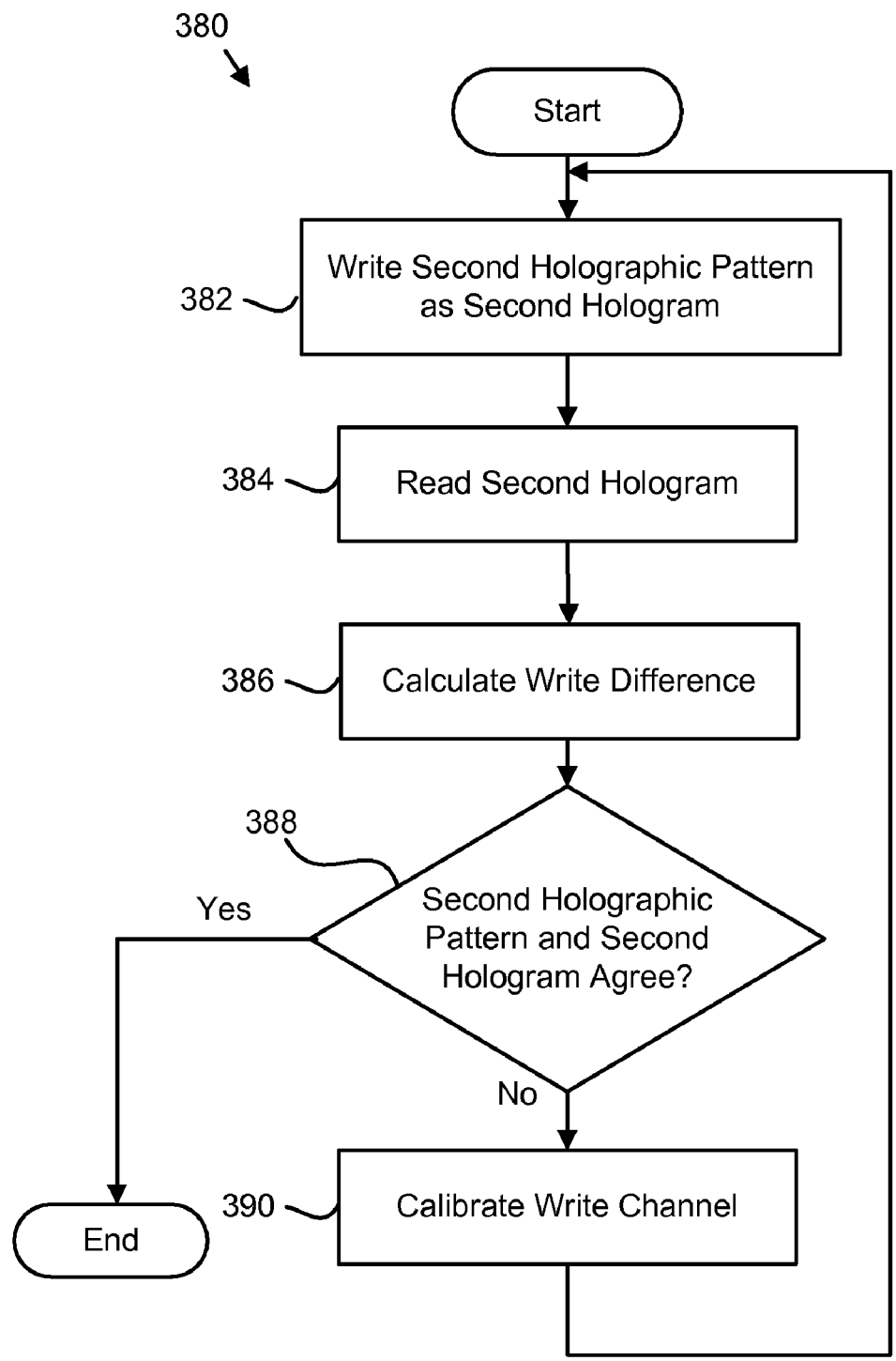
FIG. 7 is a schematic flow chart diagram illustrating one embodiment of a write calibration method of the present invention.

FIG. 7 is a schematic flow chart diagram illustrating one embodiment of a write calibration method 380 of the present invention. The method 380 substantially includes the steps to carry out the function of step 308 of FIG. 5. In addition, the description of the method 380 refers to elements of FIGS. 1-5, like numbers referring to like elements. A write channel calibration software process executing on the processor 150 may embody the method 380.

The method 380 begins and in one embodiment, the write channel 160 writes 382 the second holographic pattern 143 to the holographic media 120 as the second hologram 121. The second holographic pattern 143 may be the first holographic pattern 142 so that the written second hologram 121 should be equivalent to the factory-stored hologram 122.

In addition, the calibrated read channel 180 may read 384 the second hologram 121 from the holographic media 120. The calculation module 202 calculates 386 a write difference between the read second hologram 121 and the second holographic pattern 143. In one embodiment, the calculation module 202 calculates 386 the write difference as the errors detected while decoding ECC-encoded data of the read second hologram 121. For example, calculation module 202 may decode the ECC-encoded data of the read second hologram 121 and sum the ECC errors as the write difference. Alternatively, the calculation module 202 may map the locations of ECC errors within the data of the read second hologram 121 as the part of the write difference.

In a certain embodiment, the write difference may be the errors detected decoding CRC-encoded data of the read second hologram 121. In one embodiment, the use of ECC or CRC encoded data in the second hologram 121 makes storing the second holographic pattern 143 unnecessary. Alternatively, the calculation module 202 may calculate 386 the write difference as a bit by bit comparison of corresponding bits of the read second hologram 121 and the second holographic pattern 143.

In one embodiment, the calculation module 202 calculates 386 the write difference as the difference between the read second hologram 121 g(x,y) read from the holographic media 120 and a matched filter matched to the impulse response $h(x,y) = s^*(-x,-y)$ of the second holographic pattern 143 using eqn.[1]. V(x,y) is the cross-correlation between the second hologram 121 g(x,y) and the second holographic pattern 143 s(x,y). Difference(x,y), eqn.[2], may be used to define the difference between the read second hologram 121 read from the holographic media 120 and the second holographic pattern 143.

In an alternate embodiment, the calculation module 202 calculates 386 the write difference for a plurality of write power levels for the light source 105 and durations of the light source write light-burst. In a certain embodiment, the calculation module 202 calculates 386 a write difference for each element of matrix m as shown in eqn. [2], where p is a base write power level, d is a base light source write light-burst duration, $\Delta p$ is difference of the base write power level, and $\Delta d$ is a difference of a base light source write light-burst duration. In one embodiment, $\Delta p$ is in the range of one to fifteen percent (1-15%) of the base write power p. Similarly, $\Delta d$ may be in the range of one to fifteen percent (1-15%) of the base light source write light-burst duration d.

The calculation module 202 may determine 388 if the read second hologram 121 and the second holographic pattern 143 agree. In one embodiment, the calculation module 202 determines 388 that the read second hologram 121 and the second holographic pattern 143 agree if errors detected while decoding an ECC or CRC encoding of the data of the second hologram 121 are less than a specified threshold.

Alternatively, the calculation module 202 may determine 388 that the read second hologram 121 and the second holographic pattern 143 agree if V(x,y), the cross-correlation between the second hologram 121 and the second holographic pattern 143 as calculated with eqn.[1], is less than a specified correlation threshold. If the calculation module 202 determines 388 that the read second hologram 121 and the second holographic pattern 143 agree, the write channel 160 is calibrated and the method 380 terminates.

If the calculation module 202 determines 388 that the read second hologram 121 and the second holographic pattern 143 do not agree, the calibration module 204 may calibrate 390 the write channel 160 using the write difference. The calibration module 204 may detect a pattern in the write difference. In addition, the calibration module 204 may adjust one or more elements of the write channel 160 to mitigate the pattern. For example, a data array of the second hologram 121 may be offset by a row from a data array of the second holographic pattern 143. The calibration module 204 may adjust the alignment of the spatial light modulator 114 to mitigate the pattern. Calibration module 204 may make other write calibration adjustments, including the write power-level of light source 105, the duration of the write laser light-burst, and adjusting the write lenses 135, 137, 139, and the sensitivity of detector 130. For example, the calibration module 204 may set the write power level of the light source 110 and the write duration of the light source light-burst to the values of matrix m of eqn.[3] with the smallest write difference.

After the calibration module 204 calibrates 390 the write channel 160, the processor 150 may direct the write channel 160 to write 382 the second holographic pattern 143 as another instance of the second hologram 121. The processor 150 may further direct the calibrated read channel 180 to read 384 the new instance of the second hologram 121 and the calculation module 202 again determines 346 if the read factory-stored hologram 122 and the first holographic pattern 142 agree. The method 380 may iteratively calculate 388 the write difference and calibrate 390 the write channel 160 until the write channel 160 is calibrated.

Figure 8:
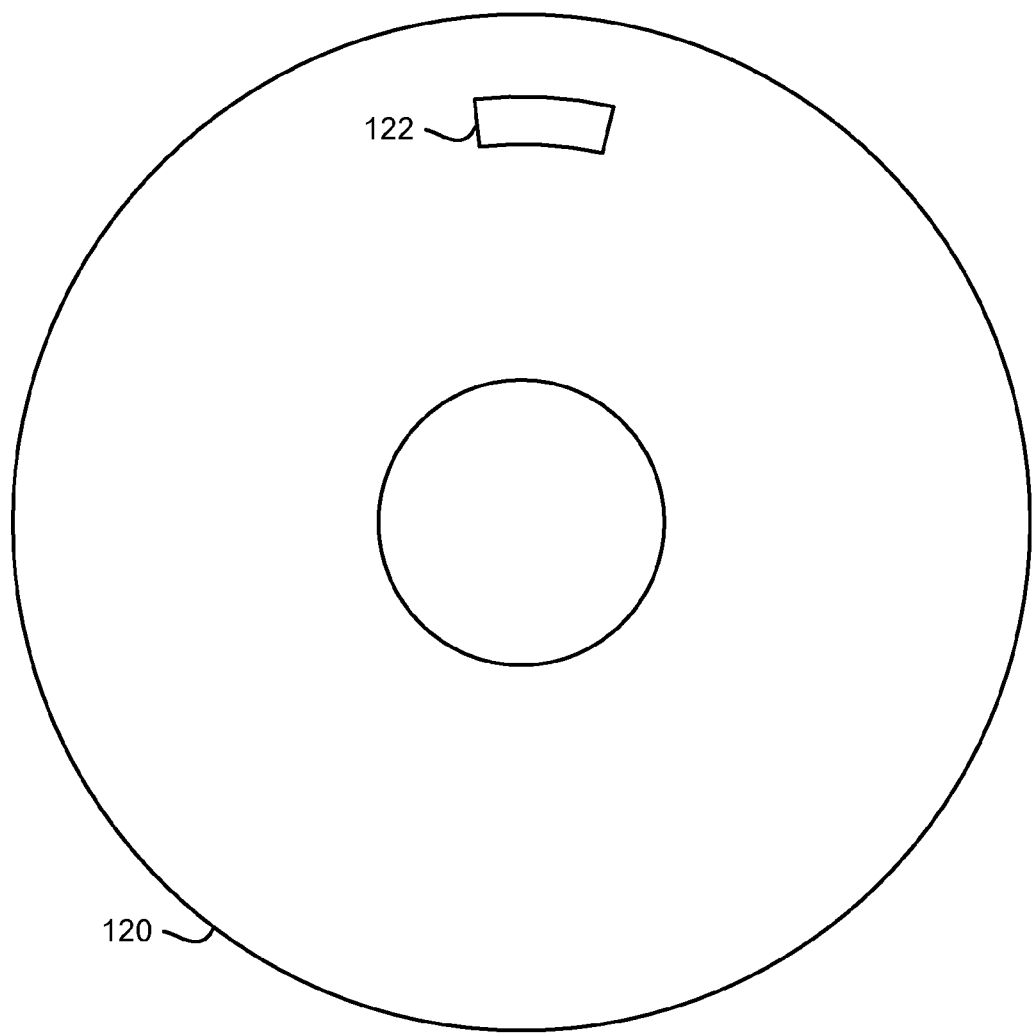
FIG. 8 is a top view drawing illustrating one embodiment of a holographic media with inserted factory-stored hologram of the present invention.

FIG. 8 is a top view drawing illustrating one embodiment of a holographic media 120 with an inserted factory-stored hologram 122 of the present invention. The holographic media 120 may be the holographic media 120 of FIGS. 1-3.

The holographic media 120 includes the factory-stored hologram 122. In one embodiment, the factory-stored hologram 122 is configured as a read-only hologram. The factory-stored hologram 122 may be adhered to the holographic media 120.

Figure 9:
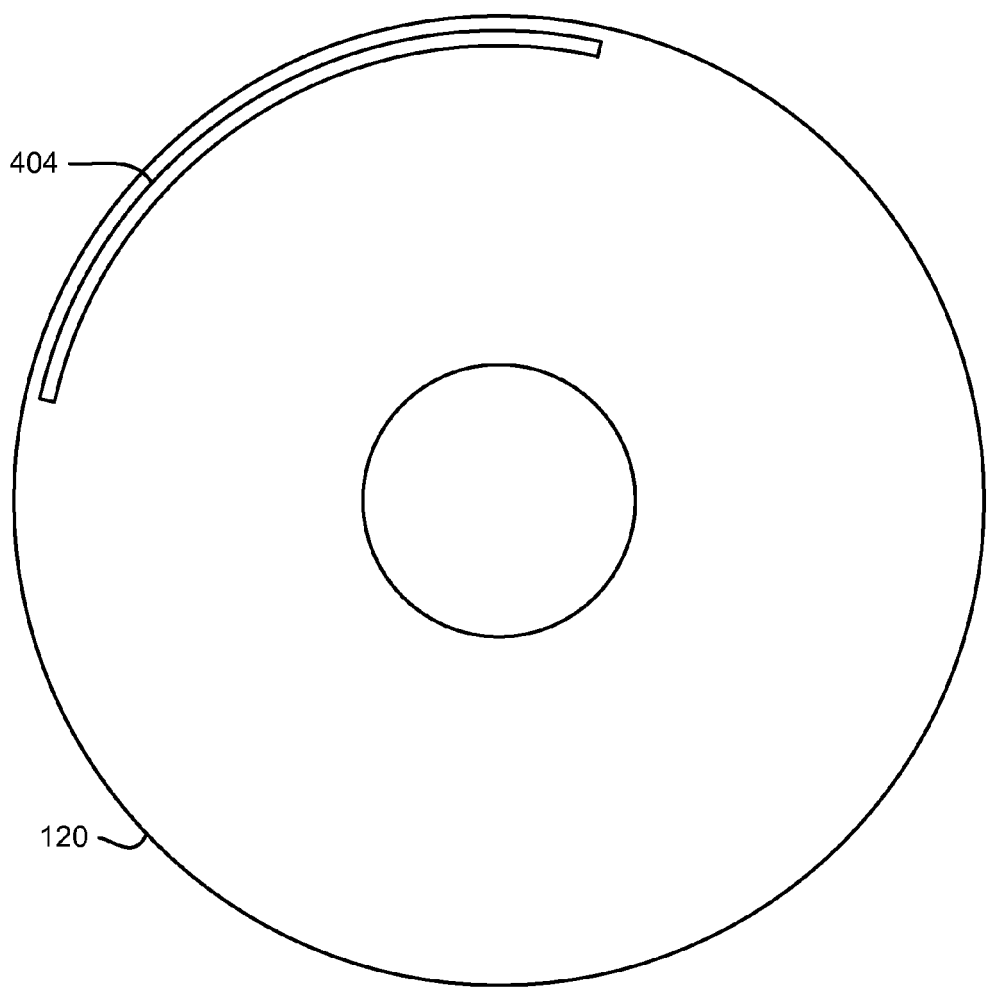
FIG. 9 is a top view drawing illustrating one embodiment of a holographic media with read-only portion of the present invention.

FIG. 9 is a top view drawing illustrating one embodiment of a holographic media 120 with read-only portion 404 of the present invention. The holographic media 120 may be the holographic media 120 of FIGS. 1-3.

In one embodiment, the read-only portion 404 maybe configured as one or more tracks of one or more sectors of the holographic media 120. In addition, the read-only portion 404 may be demarked with one or more header segments. The read-only portion 404 configured on any portion of the holographic media 120.

In one embodiment, the processor 150 is logically prevented from writing within the read-only portion 404. The factory-stored hologram 122 may be precision written within the read-only portion 404.

The embodiment of the present invention calculates 348 a read difference using a factory-stored hologram 122. In addition, the present invention may calibrate 350 the read channel 100 with the read difference. The present invention may also calculate 388 a write difference and calibrate 390 the write channel 160 with the write difference.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to calibrate a holographic storage device, the apparatus comprising:
   a read channel reading a factory-stored hologram from a holographic media; and
   a calculation module calculating a read difference between the read factory-stored hologram and a first holographic pattern that digitally describes the factory-stored hologram using Difference(x,y), where Difference(x,y) is 1−V(x,y) evaluated with a function selected from an arithmetic mean, a geometric mean, and a root-mean-square, and wherein V(x,y) is a matched filter cross-correlation.

2. The apparatus of claim 1, further comprising a calibration module calibrating the read channel with the read difference, wherein calibrating the read channel comprises:
   detecting a pattern in the read difference; and
   adjusting the read channel to mitigate the pattern.

3. The apparatus of claim 2, further comprising:
   a write channel writing a second holographic pattern to the holographic media as a second hologram after a read workload is completed and in response to a pending write workload, wherein the second holographic pattern digitally describes the second hologram;
   the calibrated read channel further reading the second hologram from the holographic media; and
   the calculation module further calculating a write difference between the read second hologram and the second holographic pattern.

4. The apparatus of claim 3, wherein the calculation module calculates both the read difference and the write difference using Difference(x,y).

5. The apparatus of claim 4, wherein the matched filter cross-correlation V(x,y) is calculated as $V(x,y)=\iint g(\xi,\eta)s^*(\xi-x,\eta-y)]\,d\xi\,d\eta$ where $\xi$ is the integration variable along an X axis, η is the integration variable along a Y axis, and s*(−x,−y) is a matched filter matched to an impulse response.

6. The apparatus of claim 3, the calibration module further calibrating the write channel with the write difference, wherein calibrating the write channel comprises:
  detecting a pattern in the write difference; and
  adjusting the write channel to mitigate the pattern.

7. A computer program product comprising a non-transitory computer useable medium having a computer readable program, wherein the computer readable program when executed on a computer causes the computer to:
  read a factory-stored hologram from a holographic media with a read channel; and
  calculate a read difference between the read factory-stored hologram and a first holographic pattern that digitally describes the factory-stored hologram using Difference(x,y), where Difference(x,y) is 1−V(x,y) evaluated with a function selected from an arithmetic mean, a geometric mean, and a root-mean-square, and wherein V(x,y) is a matched filter cross-correlation.

8. The computer program product of claim 7, wherein the computer readable code further causes the computer to calibrate the read channel with the read difference.

9. The computer program product of claim 7, wherein the computer readable code further calibrates the read channel by causing the computer to:
  detect a pattern in the read difference; and
  adjust the read channel to mitigate the pattern.

10. The computer program product of claim 9, wherein the computer readable code further causes the computer to:
  write a second holographic pattern to the holographic media as a second hologram, wherein the second holographic pattern digitally describes the second hologram;
  read the second hologram from the holographic media with the calibrated read channel; and
  calculate a write difference between the read second hologram and the second holographic pattern.

11. The computer program product of claim 10, wherein the computer readable code further causes the computer to calibrate the write channel with the write difference.

12. The computer program product of claim 11, wherein calibrating the write channel comprises the computer:
  detecting a pattern in the write difference; and
  adjusting the write channel to mitigate the pattern.

13. The computer program product of claim 10, wherein the write difference comprises errors detected decoding Circular Redundancy Check (CRC)-encoded data of the read second hologram.

14. The computer program product of claim 10, wherein the write difference comprises errors detected decoding Error Correction Code (ECC)-encoded data of the read second hologram.

15. The computer program product of claim 10, wherein the write difference comprises a matched filter correlation between the read second hologram and the second holographic pattern.

16. The computer program product of claim 10, wherein the computer executes the operations of claim 10 after a read workload is completed and if and only if there is a pending write workload.

17. The computer program product of claim 7, wherein the read difference comprises errors detected decoding ECC-encoded data of the read factory-stored hologram.

18. The computer program product of claim 7, wherein the read difference comprises errors detected decoding CRC-encoded data of the read factory-stored hologram.

19. The computer program product of claim 7, wherein the calculating of the read difference comprises a matched filter correlation between the read factory-stored hologram and the first holographic pattern.

20. The computer program product of claim 7, wherein the matched filter cross-correlation V(x,y) is calculated as V(x,y)=∫∫g(ξ,η)s*(ξ−x, η−y)] dξ dη where ξ is the integration variable along an X axis, η is the integration variable along a Y axis, and s*(−x,−y) is a matched filter matched to an impulse response.

21. A system to calibrate a holographic storage device, the system comprising:
  a holographic media storing digital data and comprising a factory-stored hologram;
  a read channel reading the factory-stored hologram from the holographic media;
  a processor comprising
    a calculation module calculating a read difference between the read factory-stored hologram and a first holographic pattern that digitally describes the factory-stored hologram using Difference(x,y), where Difference(x,y) is 1−V(x,y) evaluated with a function selected from an arithmetic mean, a geometric mean, and a root-mean-square, and wherein V(x,y) is a matched filter cross-correlation; and
    a calibration module calibrating the read channel with the read difference, wherein calibrating the read channel comprises detecting a pattern in the read difference and adjusting the read channel to mitigate the pattern.

22. The system of claim 21, further comprising:
  a write channel writing a second holographic pattern to the holographic media as a second hologram after a read workload is completed and in response to a pending write workload, wherein the second holographic pattern digitally describes the second hologram;
  the calibrated read channel further reading the second hologram from the holographic media; and
  the calculation module further calculating a write difference between the read second hologram and the second holographic pattern.

23. The system of claim 22, wherein the calibration module further calibrating the write channel with the write difference, wherein calibrating the write channel comprises:
  detecting a pattern in the write difference; and
  adjusting the write channel to mitigate the pattern.

24. A method for calibrating a holographic storage device, comprising integrating processor-readable code into a holographic storage device processor, wherein the code in combination with the holographic storage device processor is capable of performing the following:
  reading a factory-stored hologram from a holographic media with a read channel; and
  calculating a read difference between the read factory-stored hologram and a first holographic pattern that digitally describes the factory-stored hologram using Difference(x,y), where Difference(x,y) is 1−V(x,y) evaluated with a function selected from an arithmetic mean, a geometric mean, and a root-mean-square, and wherein V(x,y) is a matched filter cross-correlation.

25. The method of claim 24, further comprising calibrating the read channel with the read difference, wherein calibrating the read channel comprises:
  detecting a pattern in the read difference; and
  adjusting the read channel to mitigate the pattern.

26. The method of claim 24, further comprising storing the first holographic pattern as the factory-stored hologram on the holographic media.

27. The method of claim 26, wherein the factory-stored hologram is precision written on the holographic media.

28. The method of claim 26, wherein the factory-stored hologram resides on a read-only portion of the holographic media.

29. The method of claim 28, wherein the read-only portion is inserted in the holographic media.

30. The method of claim 28, wherein the read-only portion is configured as a write-protected portion of the holographic media.

31. The method of claim 24, wherein the read difference comprises a comparison selected from a comparison of error correction code (ECC) soft errors of the read factory-stored hologram and an error threshold, a comparison of circular redundancy code (CRC) errors of the read factory-stored hologram and the error threshold, and a matched filter cross-correlation between the read factory-stored hologram and the first holographic pattern.

32. The method of claim 24, further comprising:
  writing a second holographic pattern to the holographic media as a second hologram after a read workload is completed and in response to a pending write workload, wherein the second holographic pattern digitally describes the second hologram;
  reading the second hologram from the holographic media with the calibrated read channel;
  calculating a write difference between the read second hologram and the second holographic pattern; and
  calibrating the write channel by detecting a pattern in the write difference and adjusting the write channel to mitigate the pattern.

33. An apparatus to calibrate a holographic storage device, the apparatus comprising:
  means for reading a factory-stored hologram from a holographic media;
  means for calculating a read difference between the read factory-stored hologram and a first holographic pattern that digitally describes the factory-stored hologram using Difference(x,y), where Difference(x,y) is $1-V(x,y)$ evaluated with a function selected from an arithmetic mean, a geometric mean, and a root-mean-square, and wherein $V(x,y)$ is a matched filter cross-correlation;
  means for calibrating the reading means with the read difference;
  means for writing a second holographic pattern to the holographic media as a second hologram after a read workload is completed and in response to a pending write workload, wherein the second holographic pattern digitally describes the second hologram;
  means for reading the second hologram from the holographic media with the calibrated reading means;
  means for calculating a write difference between the read second hologram and the second holographic pattern; and
  means for calibrating the writing means by detecting a pattern in the write difference and adjusting the write channel to mitigate the pattern.

* * * * *